United States Patent
Yilmaz et al.

(10) Patent No.: US 8,063,442 B2
(45) Date of Patent: Nov. 22, 2011

(54) POWER DEVICE WITH IMPROVED EDGE TERMINATION

(75) Inventors: Hamza Yilmaz, Saratoga, CA (US); Daniel Calafut, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/982,051

(22) Filed: Dec. 30, 2010

(65) Prior Publication Data

US 2011/0089488 A1    Apr. 21, 2011

Related U.S. Application Data

(60) Division of application No. 12/425,326, filed on Apr. 16, 2009, now Pat. No. 7,863,708, which is a continuation of application No. 11/396,362, filed on Mar. 31, 2006, now Pat. No. 7,521,773.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/330; 257/331; 438/647
(58) Field of Classification Search .......... 257/330, 257/331; 438/647
See application file for complete search history.

(56) References Cited

U.S. PATENT DOCUMENTS

| | | | |
|---|---|---|---|
| 5,424,563 A | 6/1995 | Temple et al. | |
| 5,523,599 A | 6/1996 | Fujishima et al. | |
| 5,859,446 A | 1/1999 | Nagasu et al. | |
| 6,057,577 A | 5/2000 | Barret et al. | |
| 6,204,097 B1 * | 3/2001 | Shen et al. | 438/133 |
| 6,388,286 B1 | 5/2002 | Baliga | |
| 6,573,558 B2 | 6/2003 | Disney | |
| 6,787,847 B2 | 9/2004 | Disney | |
| 6,853,033 B2 | 2/2005 | Liang et al. | |
| 7,221,011 B2 | 5/2007 | Banerjee et al. | |
| 7,291,849 B1 * | 11/2007 | Baiocchi et al. | 250/491.1 |
| 7,345,342 B2 * | 3/2008 | Challa et al. | 257/341 |
| 7,521,773 B2 | 4/2009 | Yilmaz et al. | |
| 7,863,708 B2 | 1/2011 | Yilmaz et al. | |
| 2005/0242392 A1 | 11/2005 | Pattanayak et al. | |
| 2005/0275025 A1 | 12/2005 | Lanzerstorfer | |
| 2006/0019448 A1 * | 1/2006 | Darwish et al. | 438/270 |

FOREIGN PATENT DOCUMENTS

| | | |
|---|---|---|
| AT | 505582 A2 | 2/2009 |
| DE | 112007000802 T5 | 1/2009 |
| WO | WO 2007/117954 A2 | 10/2007 |

OTHER PUBLICATIONS

Chinese Office Action for Application No. 200780011878.3, dated Mar. 8, 2010, 9 pages, including English translation.

(Continued)

*Primary Examiner* — Phuc Dang

(74) *Attorney, Agent, or Firm* — Kilpatrick Townsend & Stockton LLP

(57) ABSTRACT

A field effect transistor includes an active region and a termination region surrounding the active region. A resistive element is coupled to the termination region, wherein upon occurrence of avalanche breakdown in the termination region an avalanche current starts to flow in the termination region, and the resistive element is configured to induce a portion of the avalanche current to flow through the termination region and a remaining portion of the avalanche current to flow through the active region.

12 Claims, 8 Drawing Sheets

OTHER PUBLICATIONS

International Search Report of the International Searching Authority for Application No. PCT7US2007/064790, Mailed Jul. 15, 2008, 3 pages.

Written Opinion of the International Searching Authority for Application No. PCT7US2007/064790, Mailed Jul. 15, 2008, 6 pages.

International Preliminary Report on Patentability for Application No. PCT/US2007/064790, Mailed Sep. 30, 2008, 7 pages.

Non-Final Office Action for U.S. Appl. No. 11/396,362, Mailed May 12, 2008, 13 pages.

Requirement for Restriction/Election for U.S. Appl. No. 11/396,362, Mailed Mar. 13, 2008, 5 pages.

Notice of Allowance of U.S. Appl. No. 11/396,362, Mailed Dec. 11, 2008, 5 pages.

Notice of Allowance of U.S. Appl. No. 12/425,326, mailed on Aug. 26, 2010, 12 pages.

* cited by examiner

POWER DEVICE WITH IMPROVED EDGE TERMINATION

CROSS-REFERENCE TO RELATED APPLICATIONS

This application is a divisional of U.S. application Ser. No. 12/425,326, filed Apr. 16, 2009 now U.S. Pat. No. 7,863,708, which is a continuation of U.S. application Ser. No. 11/396,362, filed Mar. 31, 2006, now U.S. Pat. No. 7,521,773, the disclosures of which are incorporated herein by reference in their entirety for all purposes.

This application is related to the commonly assigned U.S. application Ser. No. 11/026,276, filed Dec. 29, 2004, which disclosure is incorporated herein by reference in its entirety for all purposes.

BACKGROUND

The present invention relates to power device technology, and more particularly to improved edge termination for charge balance power devices.

The charge balance concept is a promising evolution in the power device technology. Some of the defining performance characteristics for the power switch are its on-resistance, breakdown voltage and switching speed. Depending on the requirements of a particular application, a different emphasis may be placed on each of these performance criteria. For example, in the mid to high voltage range (i.e., 60 to 2,000 volts), a conventional device suffers from high resistivity, since the drift region needs to be lightly doped in order for the device to sustain high voltages during the blocking state. The high resistivity of the drift region results in higher source-to-drain on-resistance $R_{DSon}$, which in turn results in high power losses. Because of the inverse relationship between $R_{DSon}$ and the breakdown voltage, improving the breakdown voltage performance of the device while maintaining a low $R_{DSon}$ poses a challenge.

Various charge balancing structures in the device drift region, including buried electrodes, opposite polarity pillars and floating regions, have been developed to address this challenge with varying degrees of success. The charge balancing techniques aim to maintain a substantially uniform electric field within the drift region in order to increase the breakdown voltage of the device. Thus, for the same breakdown voltage, the drift region can be higher doped thereby reducing $R_{DSon}$.

However, one problem with the design of charge balance devices is the edge termination area. It is a challenge to achieve charge balance at the interface between the active region and the termination region since an opposing junction to couple to the last active cell can be difficult to implement. If all the active cells are identically charge balanced except at the active to termination interface region, then this interface region becomes the limiting factor in achieving high breakdown voltage. The edge termination breakdown at low current levels does not hinder device performance however, during high current avalanche events such as unclamped inductive load (UIL) switching, the limited area of the termination region relative to the active array cannot handle the power losses. This detrimentally impacts the safe operating area (SOA) of the device.

Thus, what is desirable is a structure and method that enable a high device blocking capability, low on-resistance, and high current handling capability, particularly the capability to sustain high avalanche current in the active to termination interface region.

BRIEF SUMMARY

In accordance with an embodiment of the invention, a field effect transistor includes an active region and a termination region surrounding the active region. A resistive element is coupled to the termination region, wherein upon occurrence of avalanche breakdown in the termination region an avalanche current starts to flow in the termination region, and the resistive element is configured to induce a portion of the avalanche current to flow through the termination region and a remaining portion of the avalanche current to flow through the active region.

In one embodiment, the termination region includes a termination well of a first conductivity type extending to a first depth within a drift region of a second conductivity type, and the active region includes an active well of the first conductivity type extending to a second depth within the drift region, the first depth being deeper than the second depth.

In another embodiment, the termination well forms one end of the resistive element, and the other end of the resistive element is biased to ground potential during operation.

In another embodiment, the termination well forms a ring surrounding the active region. The termination well includes a plurality of discontinuous well contact regions intermittently placed around the active region. The plurality of well contact regions are of the first conductivity type.

In another embodiment, a first interconnect layer extends over the active region and a portion of the termination region. A second interconnect layer, having a lower conductivity than the first interconnect layer, is configured to electrically connect the termination well to the first interconnect layer.

In yet another embodiment, an interconnect layer has a first portion extending over the active region and a second portion extending over the termination region. A dielectric layer partially insulates the first and second portions of the interconnect layer from one another, wherein the second portion of the interconnect layer forms a part of the resistive element.

In yet another embodiment, the second portion of the interconnect layer serves as a filed plate extending over the termination region.

In another embodiment, during operation, one end of the resistive element is biased to ground potential.

In accordance with another embodiment of the invention, a field effect transistor includes an active region and a termination region surrounding the active region. A resistive means is coupled to the termination region, wherein upon occurrence of avalanche breakdown in the termination region an avalanche current starts to flow in the termination region, and when the avalanche current reaches a predetermined level the resistive means operates to induce a portion of the avalanche current to flow through the termination region and a remaining portion of the avalanche current to flow through the active region.

In accordance with yet another embodiment of the invention, a method of reducing current flow in the termination region of a field effect transistor during avalanche breakdown is as follows. A resistive element is coupled between the termination region and a ground potential, wherein upon occurrence of avalanche breakdown in the termination region an avalanche current starts to flow, and the resistive element operates to induce a portion of the avalanche current to flow through the termination region and a remaining portion of the avalanche current to flow through an active region of the field effect transistor.

In one embodiment, an interconnect layer is formed having a first portion extending over the active region and a second portion extending over the termination region, wherein the second portion of the interconnect layer forms a part of the resistive element.

In another embodiment, a termination well of a first conductivity type is formed in a drift region of a second conductivity type, wherein one end of the resistive element is coupled to the termination well and the other end of the resistive element is biased to ground potential during operation.

In yet another embodiment, the termination well forms a ring surrounding the active region, and a plurality of discontinuous well contact regions of the first conductivity type are formed in the termination well such that the plurality of discontinuous well contact regions are intermittently formed around the active region.

In another embodiment, a first interconnect layer is formed in the termination region. A second interconnect layer is formed extending over the active region and termination region, wherein the first interconnect layer electrically connects the termination well to the second interconnect layer, and the second interconnect layer has a higher conductivity than the first interconnect layer.

A further understanding of the nature and the advantages of the invention disclosed herein may be realized by reference to the remaining portions of the specification and the attached drawings.

DETAILED DESCRIPTION

Embodiments of the present invention address the above problems and other problems by providing structures and methods that limit the current in the termination area during a UIL switching event. A resistive voltage division technique is employed in the termination region which reduces the amount of current that flows through the edge termination region during a high avalanche current event by progressively shifting an increasing percentage of the avalanche current from the edge termination region to the active cells. This technique minimizes power dissipation during UIL switching at the edge termination region and improves the SOA performance.

Figure 1:
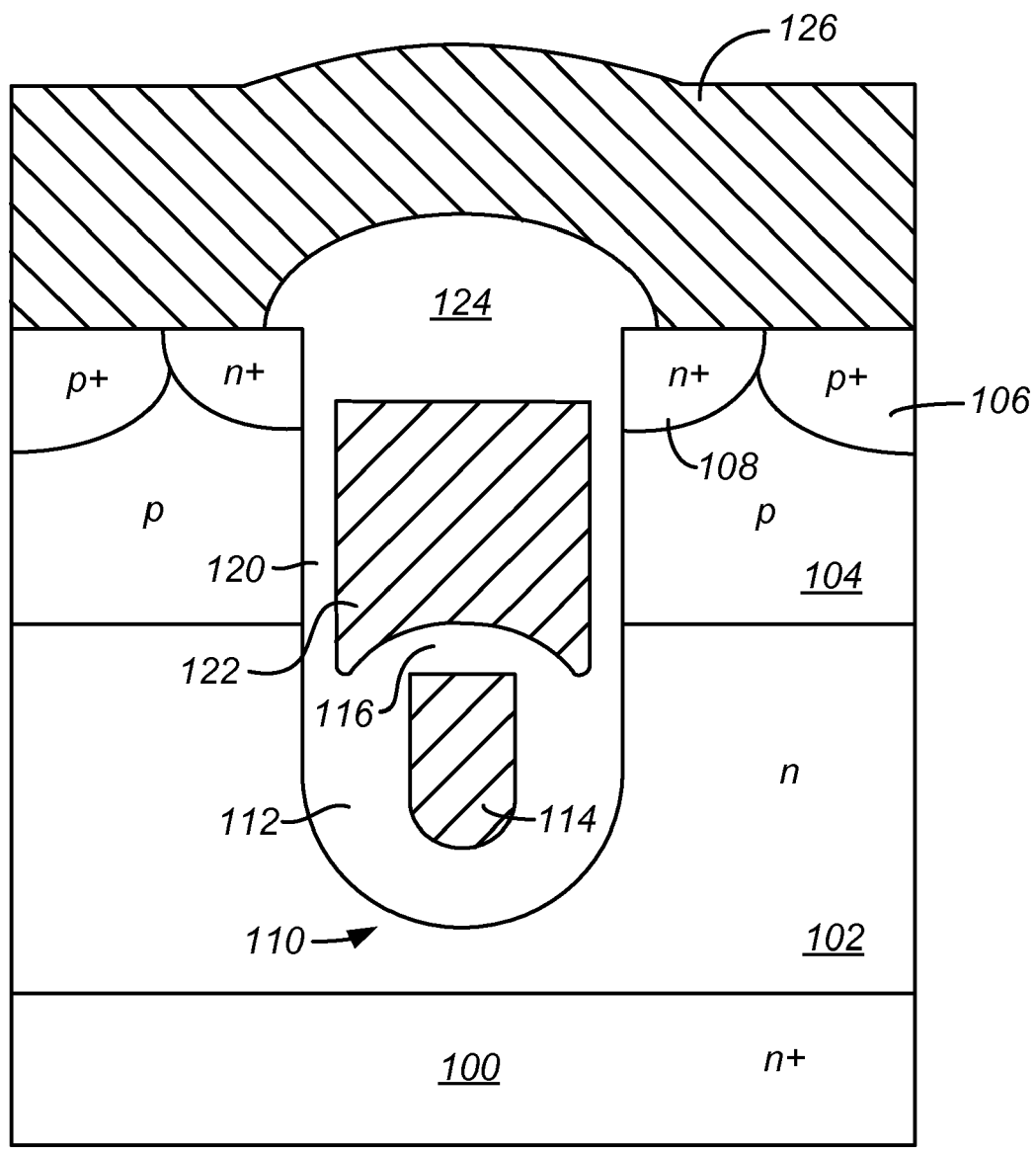
FIG. 1 shows a cross sectional view of a shielded gate trench MOSFET.

FIG. 1 shows a simplified cross sectional view of a shielded gate trench MOSFET. For simplicity, embodiments of the invention will be discussed with respect to a shielded gate trench MOSFET as the one shown in FIG. 1. However, the invention is not limited to shielded gate trench MOSFETs. Various conventional power devices, including other kinds of trenched devices as well as planar devices can benefit from the current sharing technique to reduce the power losses in the termination region. For example, the resistor divider technique of the present invention may be combined with many of the various types of power devices (and in particular with the various charge balance devices including those shown in FIGS. 2A, 2B, 3A, 3B, 4A-4C, 5A, 9A-9C, 10-24, 25A-25F, 26A-26C, 27, 28A-28D, 29A-29C) of the above-referenced U.S. patent application Ser. No. 11/026,276, filed Dec. 29, 2004, incorporated herein by reference. As with all the other figures described herein, the relative dimensions and sizes of the elements shown do not reflect actual dimensions and are for illustrative purposes only.

In FIG. 1, a trench 110 extends from a top surface through a p-type well or body region 104, and terminates in an n-type drift or epitaxial region 102. N-type source regions 108 are formed inside body region 104 adjacent to the trench 110. A drain terminal (not shown) is formed at the backside of the substrate connecting to a heavily doped n-type substrate region 100. The structure shown in FIG. 1 is repeated many times on a common substrate to form an array of transistors. The array may be configured in various cellular or striped architectures known in this art. When the transistor is turned on, a conducting channel is formed in body region 104 between source regions 108 and drift region 102 along the walls of gate trenches 110.

Trench 110 includes a gate electrode 122, and underlying shield electrode 114. In one embodiment, gate electrode 122 and shield electrode comprise polysilicon. Shield electrode 114 is insulated from adjacent regions by a shield dielectric 112, and gate electrode 122 is insulated from adjacent regions by gate dielectric 120. The gate and shield electrodes are insulated from each other by a dielectric layer 116 commonly referred to as an inter-poly dielectric or IPD. A metal layer 126 serves as a source contact to electrically contact source regions 108 and body region 104 via heavy body regions 106. A dielectric dome 124 over gate electrode 122 insulates source metal 126 from gate electrode 122.

The breakdown voltage of the MOSFET is typically limited by the cylindrical or spherical shape of the depletion region which is formed around the last diffusion junction at the edge of the die during the blocking state. Since this cylindrical or spherical breakdown voltage is lower than the parallel plane breakdown voltage in the active region of the device, the active region of the device is terminated so as to achieve a breakdown voltage for the device that is close to the active region breakdown voltage. Different termination techniques have been developed to spread the field more uniformly across the edge termination width in order to raise the breakdown voltage in the termination region to that of the active region. These include field plates, field rings, junction termination extension (JTE) and different combinations of these techniques.

Figure 2:
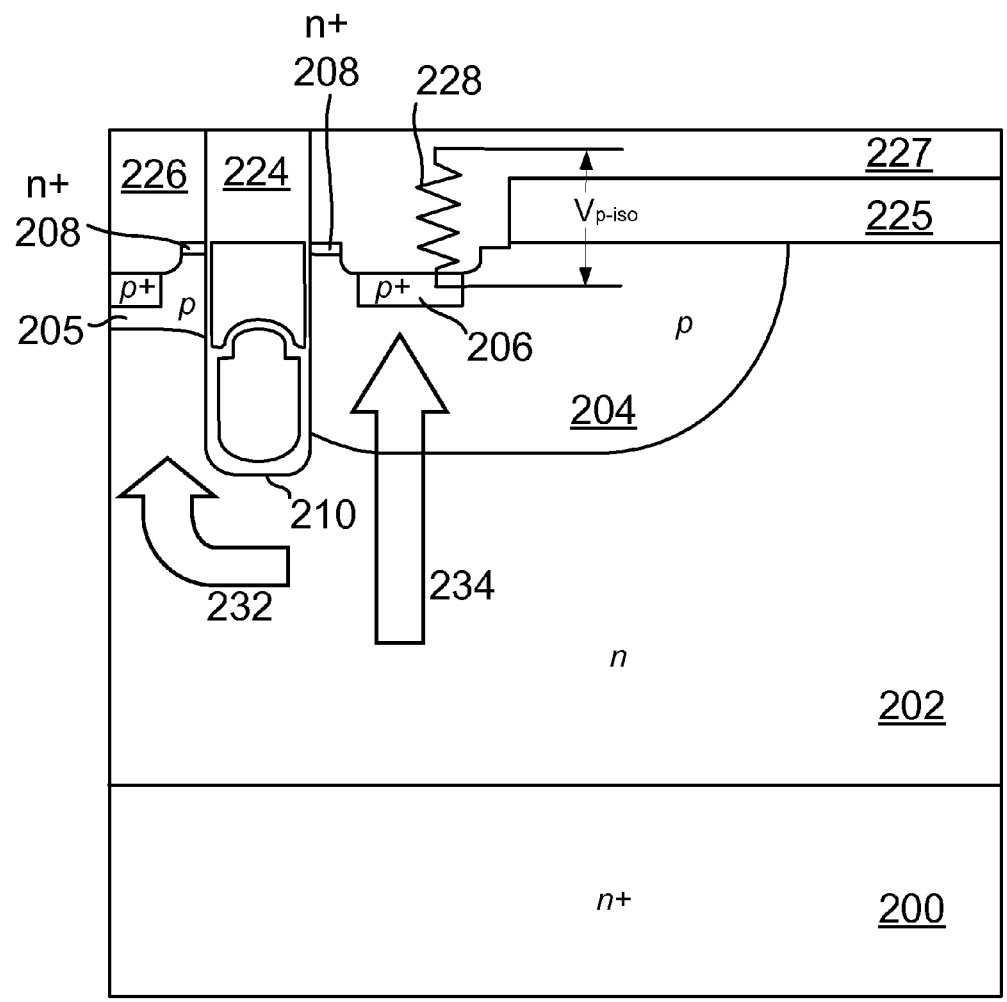
FIG. 2 shows a cross sectional view of a termination region of a shielded gate trench MOSFET according to an exemplary embodiment of the invention.

FIG. 2 shows a cross sectional view of a termination region of a shielded-gate trench MOSFET, in accordance with an embodiment of the invention. An n-type drift region 202 (e.g., epitaxial layer) extends over a highly doped n-type substrate 200. The termination structure includes a p-isolation well 204 extending deep into drift region 202. The p-isolation well 204 forms a ring around the active region of the device. The p-isolation well 204 extends deeper than the p-well 205 in the active cell array, and conducts a relatively small amount of current when the MOSFET is in the on state. This current is less than that in the active region because the deep p-isolation well 204 raises the threshold voltage of the transistor formed at the edge of p-isolation well 204. The small current through p-isolation well 204 advantageously reduces the MOSFET on-resistance. In an alternate embodiment, the p-isolation well 204 is made non-conducting by eliminating source region 208 in p-isolation well 204. The absence of a source region in p-isolation well 204 safeguards against potential parasitic bipolar triggered failures.

In FIG. 2, trench 210 and its inner layers of material (i.e., shield dielectric, shield electrode, inter-poly dielectric, gate dielectric, and gate electrode) are structurally similar to those in FIG. 1. While the last trench 210 has a similar structure to those in the active region, the invention is not limited to such structure. In other embodiments, trench 210 may be filled with a polysilicon electrode buried in a lower portion and a dielectric layer in an upper portion, or trench 210 may be substantially filled with dielectric with no conductive material buried therein. In another embodiment, trench 210 surrounds the active region in the shape of a ring.

A dielectric material 224 insulates source interconnect portions 226 and 227 from the gate electrode in trench 210. Dielectric material 224 also serves to partially insulate source interconnect portions 226 and 227 from one another. That is, source interconnect portions 226 and 227 are in part insulated from one another by dielectric 224, but are electrically connected together along a third dimension (not shown). By partially insulating source interconnect portions 226 and 227 from one another, a high resistance path (depicted by resistor 228) is created. In one embodiment, source interconnect portions 226 and 227 are both from metal. In another embodiment, source interconnect portion 227 comprises polysilicon in order to obtain a higher resistance path. A number of other implementations for resistor 228 are discussed further below in reference to FIGS. 5 and 6. Source interconnect portion 227, which is insulated from the underlying regions by a field oxide layer 225, also serves as a field plate over the termination region.

In conventional termination designs, because all of the current during high current avalanche events flows through the p-isolation region, the termination structure is designed so as to minimize the resistance in the path from the p-isolation region through the source interconnect to the external source electrode. This is typically achieved by inclusion of a heavy body region in the P-isolation region where the source interconnect contacts the p-isolation region, and by use of wide contact openings for source interconnect to p-isolation contact. Further, the source interconnect portion contacting the p-isolation region is directly connected to the source interconnect portion in the active region. That is, unlike the gap created by insulation material 224 between the source interconnect portions 226 and 227 in FIG. 2, in conventional designs, portions 226 and 227 are directly connected together by source metal extending over insulation region 224. Despite the use of these various techniques to reduce the resistance in the termination region, conventional designs suffer from poor SOA performance because the relatively small area of the termination region can not handle the high avalanche current resulting in high power losses.

In direct contrast to conventional designs, embodiments of the invention significantly increase (rather than decrease) the resistance in the path from the p-isolation region through the source interconnect to the external source electrode (not shown). In one embodiment, the resistance in this path is several orders of magnitude higher than that in conventional designs. The higher resistance is shown symbolically by resistor symbol 228 in FIG. 2. Resistor 228 advantageously operates to shift an increasing percentage of the high avalanche current to the active region as depicted by the current flow line 232 in FIG. 2. This helps maintain the p-isolation junction in low impact ionization/avalanche mode. Accordingly, a smaller percentage of the avalanche current, depicted by current flow line 234, flows through the p-isolation region, which in turn reduces the power dissipated in the termination region during UIL switching events. The percentage of the avalanche current that is steered into the active region is dependent on the resistance value of resistor 228 which can be accurately controlled in practice.

Since the resistor value can be easily controlled, it is possible to tailor it to particular operating conditions and die sizes. A suitable metal or polysilicon (doped or un-doped) may be chosen for source interconnect portion 227 according to the resistive properties and resistance values desired. In one embodiment, in addition to other features, the size of the contact opening over the p-isolation region 204 and/or the doping concentration in the heavy body region 206 in p-isolation region 204 are adjusted to obtain the desired resistance. In yet another embodiment wherein the p-isolation well forms a ring around the active region, its inner heavy body region 206 is intermittently formed around the active region (i.e., is not a single continuous ring). The discontinuities create resistive paths within the p-isolation well 204. In one embodiment, a resistance value of 500 k$\Omega$*μm per unit area of the termination region has shown optimal results as discussed below with respect to FIGS. 3A and 3B. However, resistance values ranging from 1 mega-$\Omega$*μm to 100 k$\Omega$*μm may also be effective depending on the design goals and the target application.

Figure 3A:
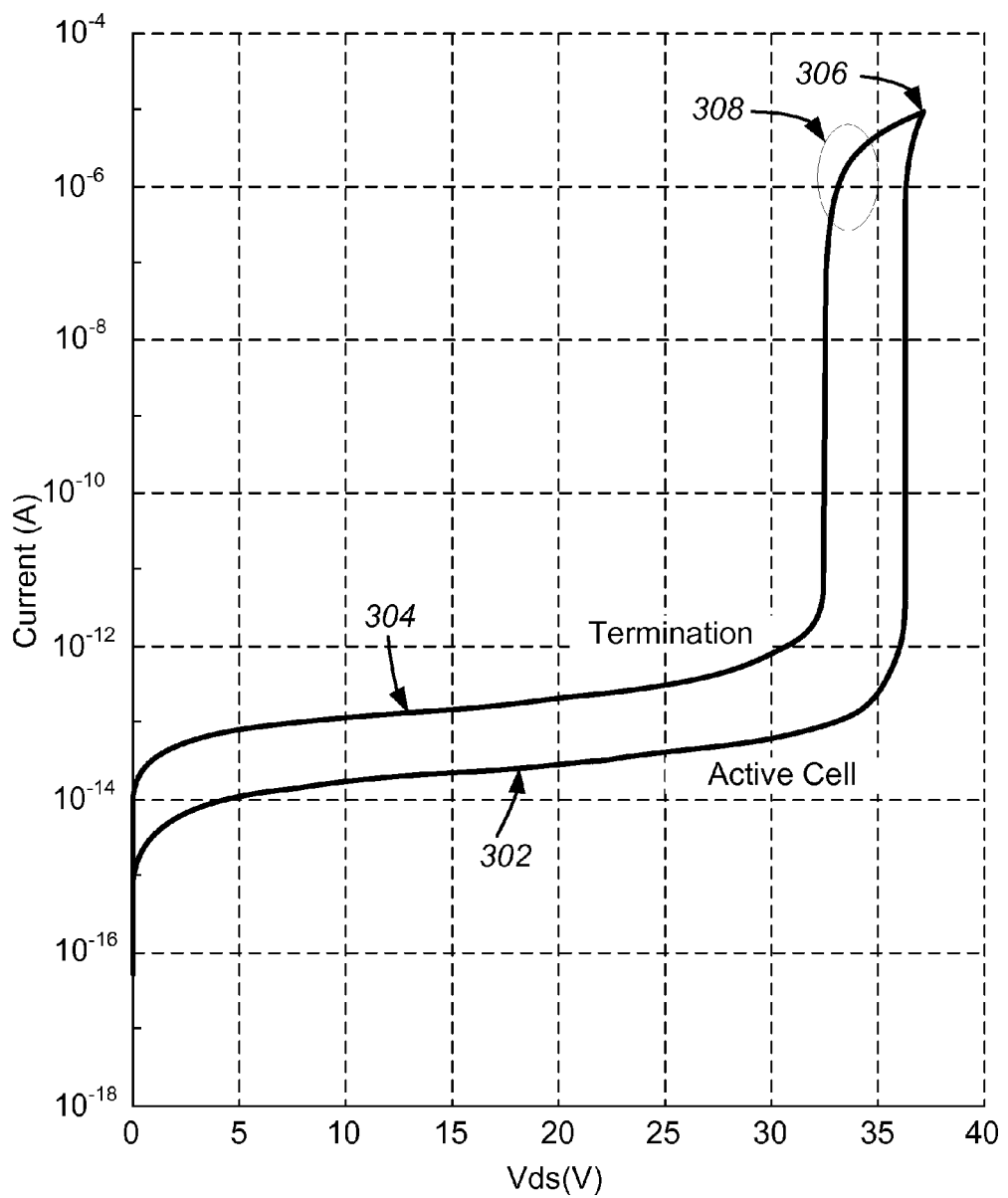
FIGS. 3A and 3B show simulation results for a MOSFET with a termination structure similar to that in FIG. 2, wherein current values for the currents flowing through the termination region and an active cell are plotted versus the drain to source voltage Vds.
Figure 3B:
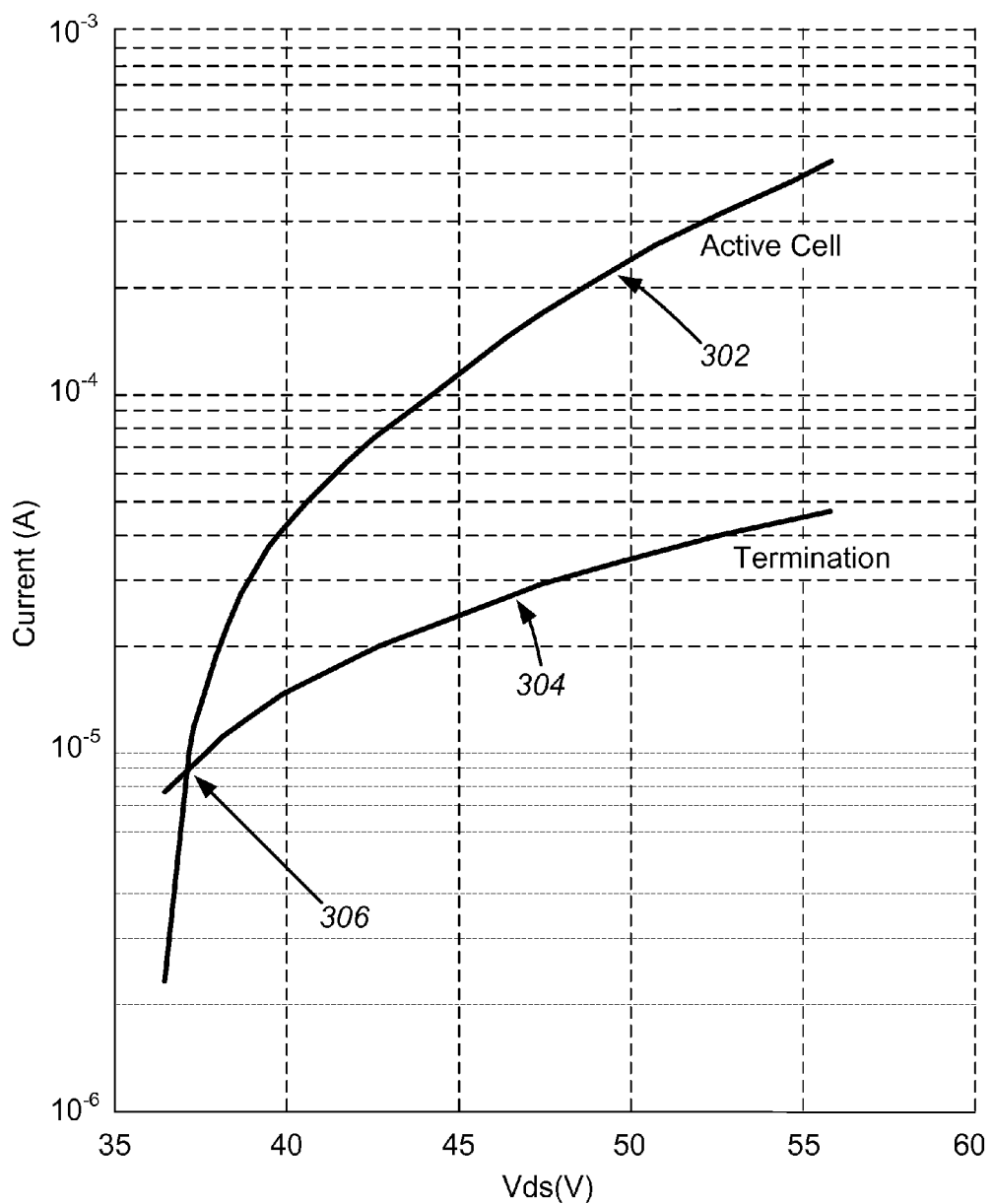

FIGS. 3A and 3B show simulation results for a MOSFET with a termination structure similar to that in FIG. 2. In FIGS. 3A and 3B, current values for the current flowing through the termination region (shown by curve 304) and the current flowing through an active cell (shown by curve 302) are plotted versus the drain to source voltage Vds. The plot in FIG. 3A shows these two currents at the Vds range of 0V-40V and the current range of $10^{-18}$ A-$10^{-4}$ A, while the plot in FIG. 3B shows these two currents at the higher Vds range of 35V-60V and the higher current range of $10^{-6}$ A-$10^{-3}$ A. A lumped (i.e., not distributed) 500 k$\Omega$*μm resistor was used as resistor 228 in the simulation. The transistor was first put into avalanche by ramping up Vds, followed by an overdriving current condition to model the UIL switching event.

As can be seen in FIG. 3A, during the initial ramping of Vds, the termination current 304 is low and a small leakage current flows through the active cell. The particular drain to source voltage at which breakdown occurs in the termination region (about 32V in FIG. 3A) is not impacted by the presence of resistor 228. However, once avalanche breakdown occurs in the termination region, resistor 228 starts influencing the flow of current when a particular avalanche current level is reached. The avalanche current level at which resistor 228 starts influencing the current flow depends on the resistance value of resistor 228. For the particular resistance value used in the FIG. 3A example, resistor 228 starts influencing the flow of current at avalanche current levels near $10^{-6}$ A where the slope of the termination current curve 304 starts to reduce. This is marked in FIG. 3A by circle 308. At this and higher avalanche current levels, resistor 228 operates to divert an increasing percentage of the termination avalanche current to the adjacent active cell.

As can be seen in FIG. 3A, avalanche breakdown occurs in the active region at about 37V, and the termination current 304 crosses over the active current at a drain current of about 0.13 A. This cross over point is marked by reference numeral 306 in FIGS. 3A and 3B. Note that in conventional designs, this cross over occurs at significantly higher current levels (e.g., 3 or 4 orders of magnitude higher than the cross over point 306 in FIGS. 3A, 3B). Since active current 302 is the simulated current for a single active cell, a current measurement for an array of active cells in an actual die would have a steeper slope than the one shown in FIG. 3B. The rise in the active cell current 302 to levels higher than the termination current 304 illustrates the shifting effect of resistor 228, which distributes the current between the termination region and the active cells at these high avalanche current levels. Note that, in general, because the same degree of charge balance achieved in the active region is difficult to obtain in the termination region, the termination region tends to have a lower breakdown voltage than the active cell array, and thus the onset of avalanche breakdown occurs in the termination region.

Figure 4A:
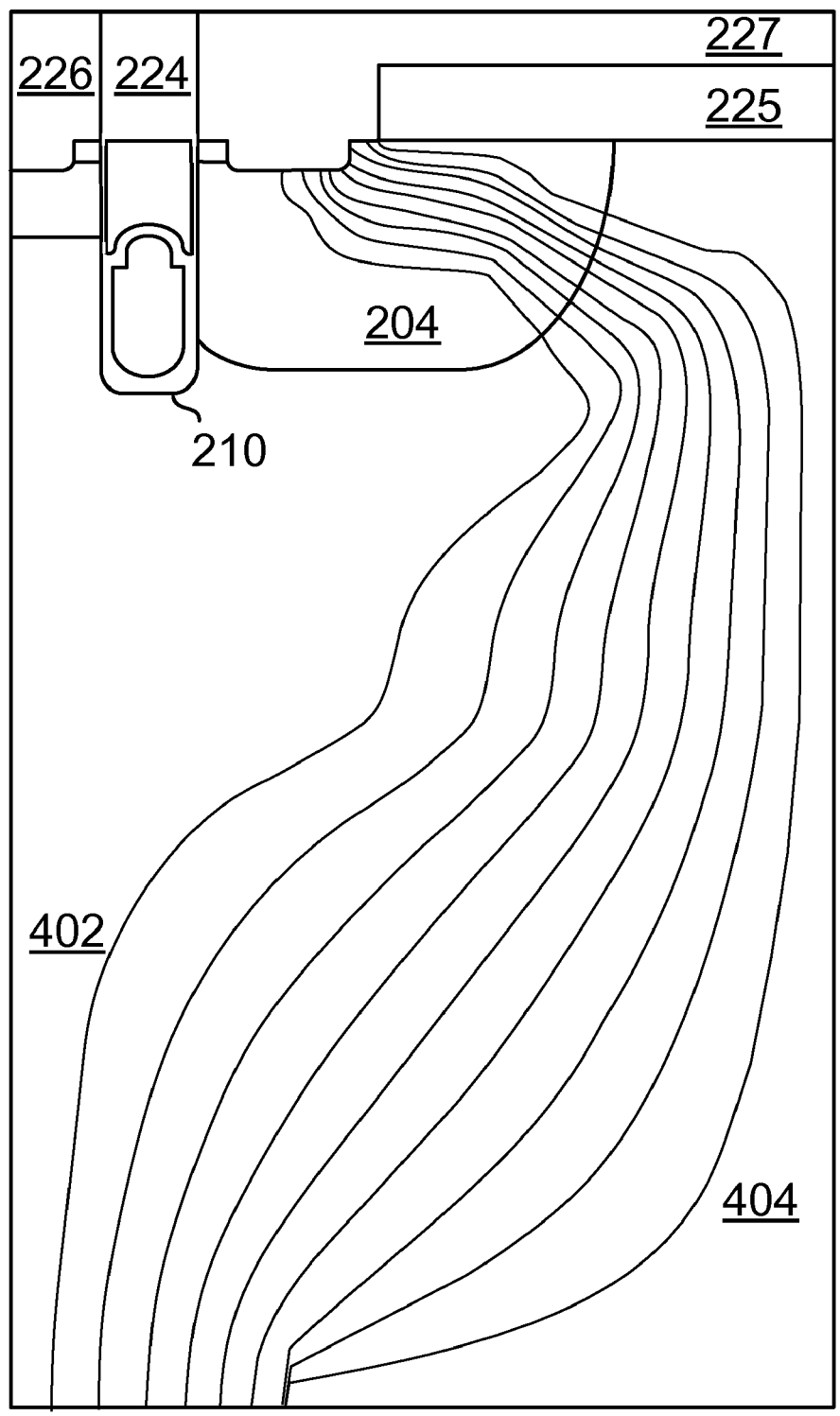
FIGS. 4A and 4B respectively show simulated current flow lines at lower and higher avalanche current levels, using the same termination design as for FIGS. 3A and 3B.
Figure 4B:
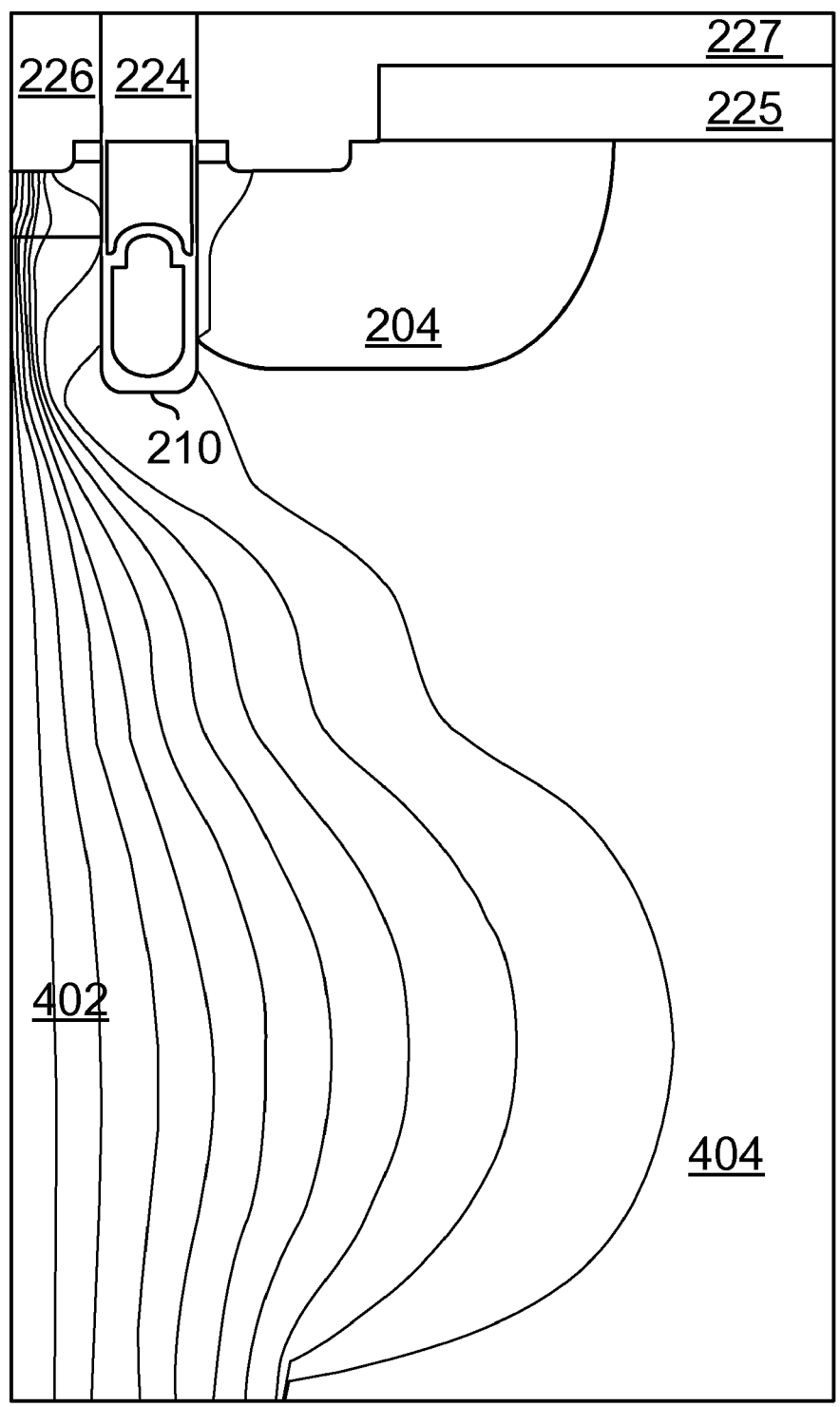

FIGS. 4A and 4B show simulations of avalanche current flow lines at lower current levels and higher current levels, respectively, using the same termination design as for FIGS. 3A and 3B. In both FIGS. 4A and 4B, the current flow lines represent increasing current levels from left to right (i.e., from region 402 to region 404). FIG. 4A shows that at lower avalanche current levels, the avalanche current flows entirely through the p-isolation well 204. FIG. 4B shows that at higher avalanche current levels, resistor 228 operates to distribute the avalanche current between the p-isolation well 204 and the active region left of trench 210.

In conventional designs where resistor 228 is absent, all of the avalanche current, even at high current levels, flows through the p-isolation region. However, during UIL switching events, since the energy of the inductive load (given by ½ $I^2L$, where I stands for current and L stands for inductance) is finite, resistor 228 effectively distributes the energy between the termination region and the active cells, thus decreasing the likelihood that there would be a failure in the active cell region (i.e., latch-up) or in the termination region (i.e., current crowding and excessive heating). A significantly improved SOA performance is thus achieved. The amount of current shifting or division is set by the resistance value, which can be easily and accurately adjusted by modifying the various components and physical features in the path through the termination to the external source electrode.

Figure 5:
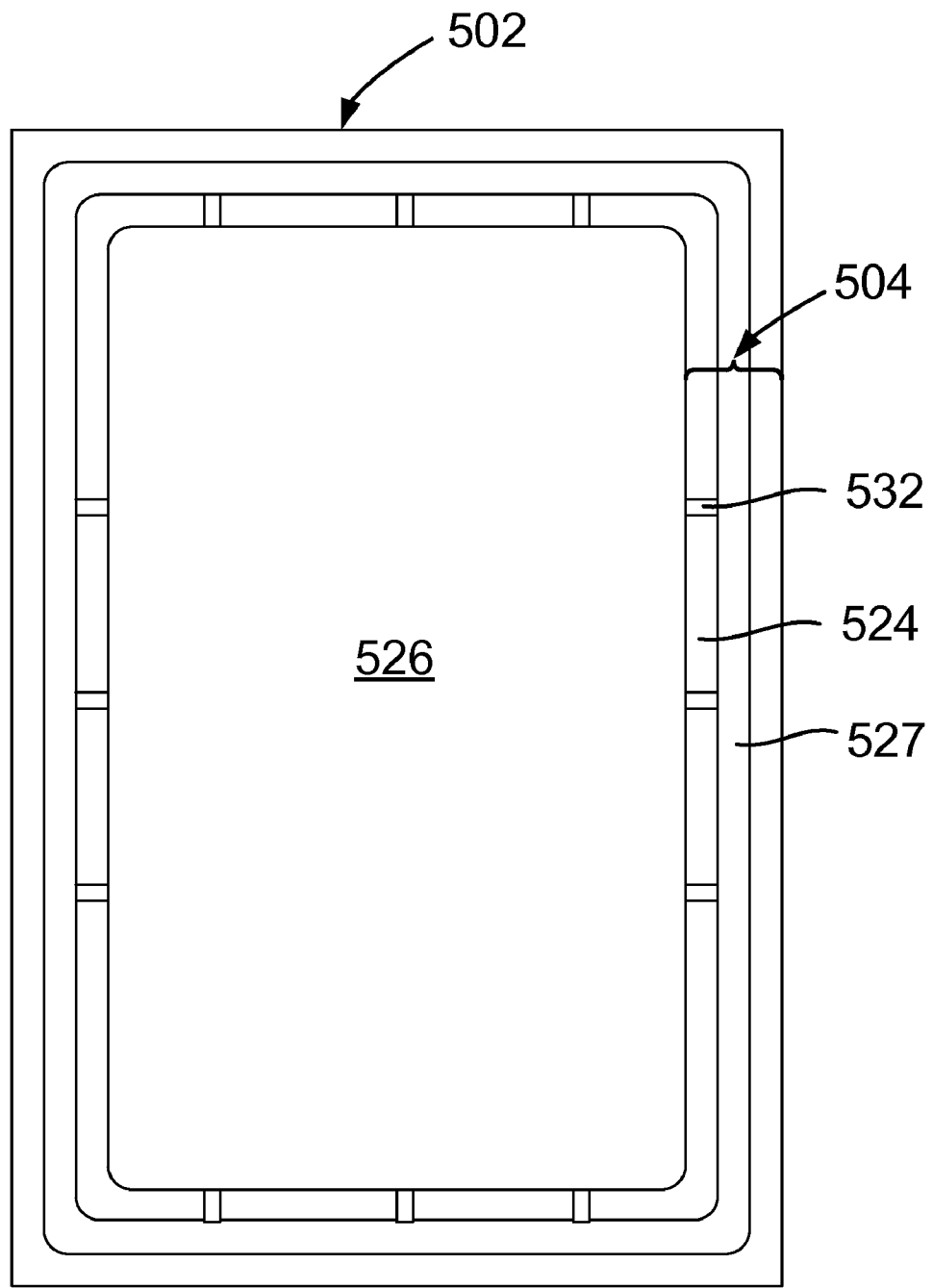
FIGS. 5 and 6 are layout views illustrating two exemplary implementations of the termination resistor, in accordance with embodiments of the invention.
Figure 6:
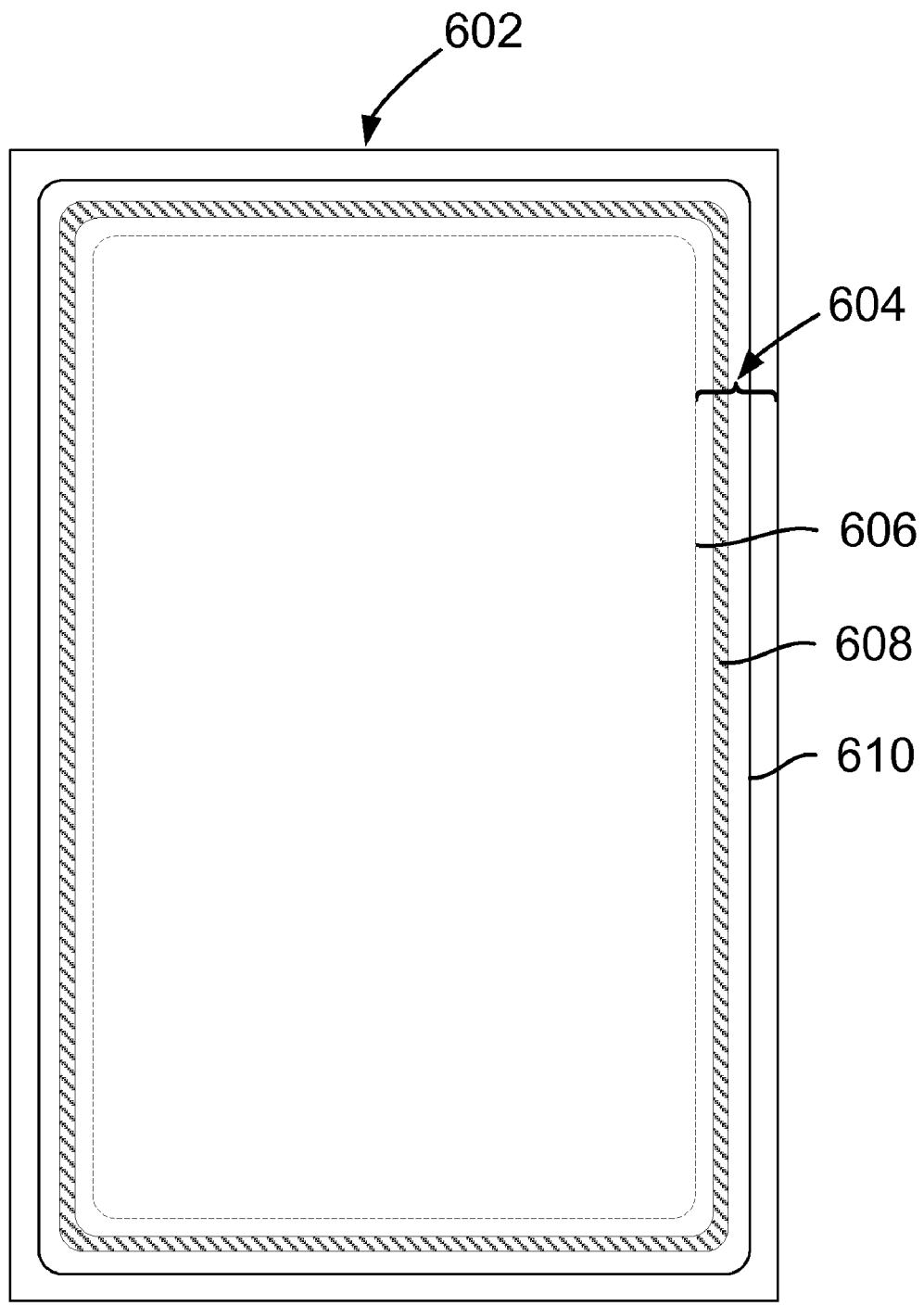

FIGS. 5 and 6 show two exemplary implementations of the resistor in the termination region. FIG. 5 is a simplified layout view of a die 502 housing a power device such as a shielded gate MOSFET with a cell structure similar to that shown in FIG. 1 and a termination region with a structure similar to that shown in FIG. 2. Die 502 includes an active interconnect 526 extending over the active region, and a termination interconnect ring 527 extending over termination region 504 around the active region. Termination interconnect ring 527 fills the contact opening over the termination p-isolation well and contacts the p-isolation well in a similar manner to termination interconnect 227 in FIG. 2. Dielectric material 524 insulates active interconnect 526 from termination interconnect ring 527 except for those areas where interconnect links 532 are present. Interconnect links 524 electrically connect termination interconnect ring 527 to active interconnect 526 at predesignated locations around the active region.

In general, active interconnect 526 is made of highly conductive material. By coupling termination interconnect rings 527 to active interconnect 526 through thin interconnect links 532, a higher resistive path is created between the termination region and the active interconnect 526. In one embodiment, termination interconnect ring 527 is from the same highly conductive material as active interconnect 526, and interconnect links 532 are made of more resistive conductors thus forming part of the resistive path. In other embodiments, one or both of the termination interconnect ring 527 and interconnect links 532 are made of more resistive conductors such as low conductivity metallic compounds or polysilicon (doped or undoped) depending on the desired resistance value.

FIG. 6 shows another implementation of the termination resistor. Die 602, similar to die 502 in FIG. 5, houses a power device such as a shielded gate MOSFET with a cell structure similar to that shown in FIG. 1 and a termination region with a structure similar to that shown in FIG. 2. The dashed line 606 delineates the active region of the die, with termination region 604 extending around active region 606 along the outer perimeter of die 602. A highly conductive sheet of interconnect 610 extends over active region 606 and a portion of termination region 604. A polysilicon ring 608 (cross hatched region) underlying the sheet of interconnect 610 extends through termination region 604 and surrounds active region 606. Polysilicon ring 608 fills the contact opening over the p-isolation well 204 (FIG. 2) thereby electrically connecting its overlying sheet of interconnect 610 to its underlying p-isolation well. Polysilicon ring 608 thus forms a resistive path between the p-isolation well and the sheet of interconnect 610. Polysilicon ring 608 may be doped or undoped depending on the desired resistance value.

While the above provides a complete description of the preferred embodiments of the invention, many alternatives, modifications, and equivalents are possible. For example, the charge balanced structures described herein in the context of a MOSFET and in particular a shielded gate trench MOSFET. Those skilled in the art will appreciate that the same techniques can apply to other types of MOSFETs and power devices such as IGBTs and lateral gate MOSFETS, and more broadly to any power device which can benefit from limiting the current levels in the edge termination region. For this and other reasons, therefore, the above description should not be taken as limiting the scope of the invention, which is defined by the appended claims.

What is claimed is:

1. A trench gate power MOSFET comprising:
   a drift region of a first conductivity type over a substrate of the first conductivity type;
   an active region comprising:
      an active well of a second conductivity type extending to a predetermined depth within the drift region;
      a plurality of gate trenches extending through the well region; and
      a plurality of source regions of the first conductivity type flanking sides of the plurality of gate trenches;
   a termination region surrounding the active region, comprising:
      a termination well of the second conductivity type extending deeper into the drift region than the active well; and
      a resistive element coupled to the termination well, wherein during a UIL switching event upon occurrence of avalanche breakdown in the termination region an avalanche current starts to flow in the termination region, and when the avalanche current reaches a predetermined level the resistive element induces a portion of the avalanche current to flow through the active region and a remaining portion of the avalanche current to flow through the termination region.

2. The field effect transistor of claim 1 wherein the termination well forms one end of the resistive element, and the other end of the resistive element is biased to ground potential during operation.

3. The field effect transistor of claim 1 wherein the termination well forms a ring surrounding the active region, the termination well comprising a plurality of discontinuous well contact regions intermittently placed around the active region, the plurality of well contact regions being of the first conductivity type.

4. The field effect transistor of claim 1 further comprising:
   a first interconnect layer extending over the active region and a portion of the termination region; and
   a second interconnect layer configured to electrically connect the termination well to the first interconnect layer, wherein the second interconnect layer has a lower conductivity than the first interconnect layer.

5. The field effect transistor of claim 4 wherein the first interconnect layer comprises metal, and the second interconnect layer comprises polysilicon.

6. The field effect transistor of claim 1 further comprising:
   an interconnect layer having a first portion extending over the active region and a second portion extending over the termination region; and
   a dielectric layer partially insulating the first and second portions of the interconnect layer from one another, the second portion of the interconnect layer forming a part of the resistive element.

7. The field effect transistor of claim 6 wherein the second portion of the interconnect layer serves as a filed plate extending over the termination region.

8. The field effect transistor of claim 1 wherein the resistive element has a value in the range of 1 k$\Omega$*μm to 1 mega-$\Omega$*μm.

9. The field effect transistor of claim 1 wherein during operation, one end of the resistive element is biased to ground potential.

10. The semiconductor device of claim 1 wherein the termination region further includes a termination trench extending into the drift region adjacent to the termination well, the termination trench surrounding the active region in the shape of a ring.

11. The field effect transistor of claim 1 wherein each gate trench comprises:
    a shield electrode insulated from the drift region by a shield dielectric; and
    a gate electrode over but insulated from the shield electrode by an inter-poly dielectric layer.

12. The field effect transistor of claim 1 wherein each gate trench comprises:
    a gate dielectric lining the gate trench sidewalls;
    a bottom dielectric thicker than the gate dielectric, lining the gate trench bottom; and
    a recessed gate electrode over the bottom dielectric.

\* \* \* \* \*